(12) United States Patent
Dickinson

(10) Patent No.: US 10,038,225 B2
(45) Date of Patent: Jul. 31, 2018

(54) BATTERY WATERING EVENT DETECTION USING A TEMPERATURE SENSOR

(71) Applicant: AeroVironment, Inc., Simi Valley, CA (US)

(72) Inventor: Blake Edward Dickinson, Monrovia, CA (US)

(73) Assignee: AEROVIRONMENT, INC., Simi Valley, CA (US)

( * ) Notice: Subject to any disclaimer, the term of this patent is extended or adjusted under 35 U.S.C. 154(b) by 0 days.

(21) Appl. No.: 15/075,384

(22) Filed: Mar. 21, 2016

(65) Prior Publication Data

US 2016/0315360 A1    Oct. 27, 2016

Related U.S. Application Data

(60) Provisional application No. 62/136,328, filed on Mar. 20, 2015.

(51) Int. Cl.
  *H01M 10/48* (2006.01)
  *G01R 31/36* (2006.01)
  *H01M 10/42* (2006.01)
  *H01M 10/44* (2006.01)

(52) U.S. Cl.
  CPC .......... *H01M 10/484* (2013.01); *G01R 31/36* (2013.01); *H01M 10/4257* (2013.01); *H01M 10/443* (2013.01); *H01M 10/486* (2013.01); *H01M 2220/20* (2013.01)

(58) Field of Classification Search
  CPC ........... H01M 10/484; H01M 10/4257; H01M 10/443; H01M 10/486; H01M 2220/20; G01R 31/36
  See application file for complete search history.

(56) References Cited

U.S. PATENT DOCUMENTS

| | | | | |
|---|---|---|---|---|
| 4,247,811 | A * | 1/1981 | Findl | G01R 31/3665 320/134 |
| 5,622,789 | A | 4/1997 | Young | |
| 6,172,487 | B1 * | 1/2001 | Brotto | H02J 7/0091 320/137 |
| 2005/0001628 | A1 * | 1/2005 | Jones | B66F 9/24 324/432 |
| 2008/0042615 | A1 * | 2/2008 | Serrels | B60L 1/003 320/101 |

(Continued)

FOREIGN PATENT DOCUMENTS

JP     10092464 A     4/1998

OTHER PUBLICATIONS

International Search Report and Written Opinion for U.S. Appl. No. PCT/US16/23115 dated Jun. 24, 2016.

*Primary Examiner* — Lisa S Park
(74) *Attorney, Agent, or Firm* — Brooks Acordia IP Law, PC; Michael Zarrabian; Eric Aagaard

(57) ABSTRACT

A method of battery cell monitoring includes measuring a temperature of an electrolyte in a battery cell using a temperature sensor, outputting from the temperature sensor a plurality of electrolyte temperature signals indicative of the temperature of the electrolyte over time, providing the plurality of electrolyte temperature signals to a system controller, determining by the system controller a sudden transition in the electrolyte temperature signals, and logging a watering event data indication in a memory in response to calculating the sudden transition.

18 Claims, 10 Drawing Sheets

(56) References Cited

U.S. PATENT DOCUMENTS

2008/0071483 A1 3/2008 Eaves
2009/0004511 A1* 1/2009 Hlavac .................... H01M 2/12
429/3

* cited by examiner

BATTERY WATERING EVENT DETECTION USING A TEMPERATURE SENSOR

CROSS-REFERENCE TO RELATED APPLICATIONS

This application claims benefit of provisional application No. 62/136,328, filed Mar. 20, 2015, which is hereby incorporated by reference for all purposes.

BACKGROUND

Field of the Invention

Embodiments pertain to battery watering, and more particularly to battery watering event detection.

Description of the Related Art

Electric-powered forklifts ("electric forklifts") 100 and other electric vehicles (EVs) are being offered in the market that use vehicle batteries 102 to supplement or entirely provide power to at least one electric motor 104 for vehicle movement (see FIG. 1). Some of these vehicle batteries 102 use lead-antimony plates which require regular watering to replace water that is lost due to, for example, electrolysis on each charging cycle when plugged into battery charger 106. Battery warranties provided with the sale of these batteries 102 may require proof of watering compliance, such as by recording watering events in a log or in maintenance books. Unfortunately, such log books may be falsified or improperly maintained. Although some battery monitors for such batteries have become available to monitor electrolyte levels as one of their inputs, these electrolyte level detectors typically only measure two states: one state that indicates sufficient electrolyte level is present and one state that indicates the electrolyte level is low or empty, and not the act of providing supplemental water to the battery itself. Such sensors may only have the ability to measure a watering event if the electrolyte levels in the battery were below the safe level when watered. A need continues to exist to provide for consistent and reliable recording of watering events in batteries that require regular supplemental watering.

SUMMARY

A method of battery cell monitoring includes measuring a temperature of an electrolyte in a battery cell using a temperature sensor, outputting from the temperature sensor a plurality of electrolyte temperature signals indicative of the temperature of the electrolyte over time, providing the plurality of electrolyte temperature signals to a system controller, determining by the system controller a sudden transition in the electrolyte temperature signals, and logging a watering event data indication in a memory in response to calculating the sudden transition. The sudden transition may indicate a change in temperature of the electrolyte of greater than one degree Celsius (C) per minute. In certain embodiments, the change in temperature of the electrolyte of greater than one degree Celsius (C) per minute is greater than one degree C. of cooling per minute. In other embodiments, the sudden transition indicates a change in temperature of the electrolyte of approximately 4 to 7 degrees C. over 5 to 10 minutes. The system controller may be a microprocessor and may form either part of a battery charger or a battery monitor. The temperature sensor may be immersed in the electrolyte of one of a plurality of battery cells in a battery. The one of the plurality of battery cells may be a center cell in the battery. The temperature sensor may be a thermistor seated in a stainless steel sheath. The temperature sensor may extend from a top of the battery cell interior down towards a bottom of the battery cell interior.

A method of battery cell monitoring may include detecting the temperature of an interior of a battery cell using a temperature sensor, outputting from the temperature sensor a plurality of temperature signals indicative of the temperature of the interior of a battery cell over time, providing the plurality of temperature signals to a processor, and calculating by the processor a sudden transition in the electrolyte temperature signals. The processor may be a data processing unit selected from the group consisting of a controller, microprocessor and processor. The method may also include storing a watering event data indication in response to calculating the sudden transition. The sudden transition may indicate the temperature sensor was not immersed in a liquid in a first time and was immersed in a liquid in a second time. In an embodiment, a change in temperature of the electrolyte of greater than one degree Celsius (C) per minute indicates the sudden transition. In other embodiments, a change in temperature of the electrolyte of approximately 4 to 7 degrees C. over 5 to 10 minutes indicates the sudden transition.

A system includes a processor configured to receive a signal from the temperature sensor, when a temperature sensor is present, the signal comprising a voltage indicative of a temperature of the temperature sensor; detect a sudden decrease in temperature of the temperature sensor; and determine whether a battery cell watering event has occurred based on the sudden change in temperature of the temperature sensor. The processor may be selected from the group consisting of a microprocessor, controller or central processing unit (CPU). In certain embodiments, the processor is embedded in a battery charger. In other embodiments, the processor is embedded in a battery monitor. Detecting the sudden decrease in temperature may include detecting a change in temperature of the temperature sensor of greater than one degree Celsius (C) per minute. The temperature sensor may be at least partially immersed in an electrolyte of a battery cell, and the temperature sensor may measure electrolyte temperatures of the battery cell near a top portion of the battery cells. The processor may be further configured to record a time and date of the determined watering event. The processor may be further configured to record a total number of occurrences of the determined watering event for the energy storage device.

A method includes measuring, by an electrolyte immersed temperature sensor, electrolyte temperature of a battery; receiving, by a processor in communication with the battery and the electrolyte immersed temperature sensor, a plurality of signals from the temperature sensor, the plurality of signals comprising temperature measurement indications of the battery; detecting a decrease in electrolyte temperature of the battery; determining whether a watering event has occurred based whether the decrease in temperature is greater than a predetermined threshold during a first predetermined period of time and whether the decrease in temperature is normalized during a second predetermined length of time.

BRIEF DESCRIPTION OF THE DRAWINGS

The components in the figures are not necessarily to scale, emphasis instead being placed upon illustrating the principals of the invention. Like reference numerals designate corresponding parts throughout the different views. Embodiments are illustrated by way of example and not limitation in the figures of the accompanying drawings, in which.

DETAILED DESCRIPTION

A system is disclosed that provides for consistent and reliable detecting and recording of watering events in batteries that require regular watering. The method may include detecting a temperature of an electrolyte in a battery cell using a temperature sensor that is disposed in the cell, outputting from the temperature sensor a plurality of electrolyte temperature signals over time that are indicative of the temperature of the electrolyte or a dry cell, providing the plurality of electrolyte temperature signals to a system controller such as a microprocessor or processor, calculating by the system controller a sudden transition in the electrolyte temperature signals, and then logging a watering event data indication in a memory in response to calculating the sudden transition of the temperature signals. With such a system, a user may later provide such automatic and logged water detection events to those having an interest in determining whether the battery has been adequately maintained with water over time.

Figure 1:
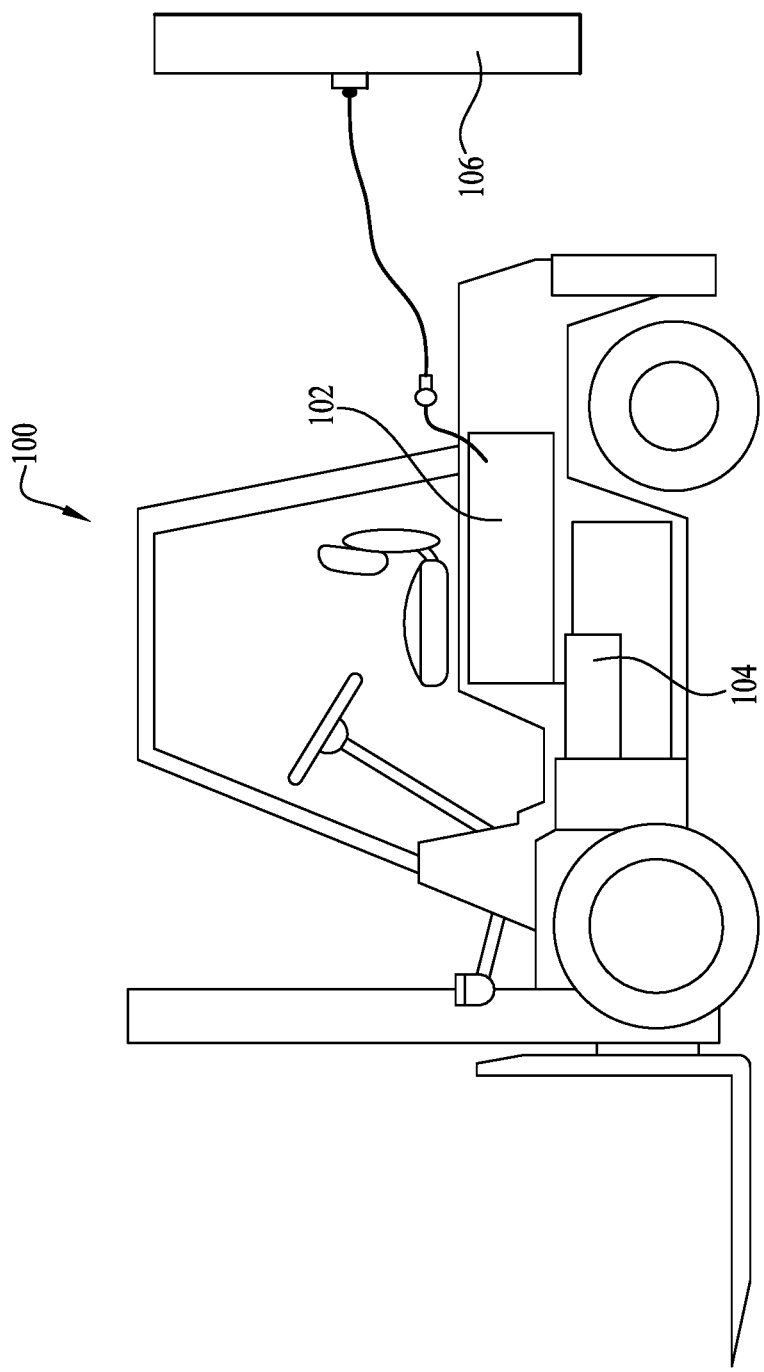
FIG. 1 is a prior art diagram of an electric forklift being charged by a battery charger.
Figure 2:
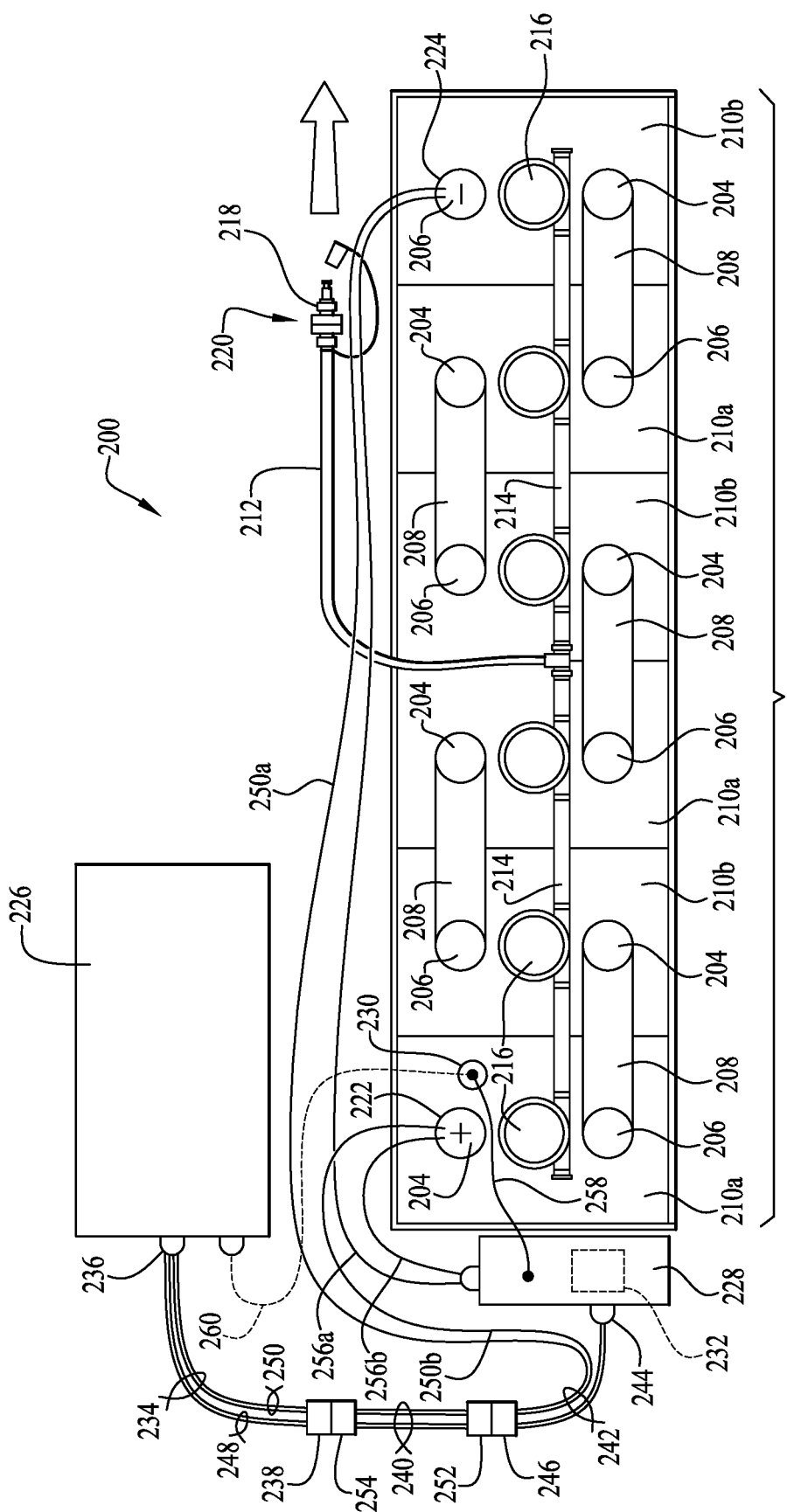
FIG. 2 is a top plan view of one embodiment of a water event detection system having a thermistor in communication with a system controller that is configured to detect sudden changes in battery electrolyte temperature.

FIG. 2 is a top plan view of one embodiment of a water event detection system 200 having a thermistor to detect and measure an internal temperature of one of a collection of batteries connected in series, with the thermistor in communication with a controller. Five batteries 202 each having respective positive and negative terminals (204, 206) may be positioned next to one another. Inter-cell connectors 208 may electrically couple each negative terminal 206 of a first battery 210a to the positive terminal 204 of an adjacent battery 210b to establish all batteries in electrical series. Although five batteries 202 are illustrated as disposed adjacent to and abutting one another in a linear arrangement, different numbers of batteries may be provided and they may be positioned in other arrangements to accomplish convenient electrical connections between them. For example, in other embodiments, the batteries 202 may be electrically connected in parallel or may be electrically connected in some combination of series and parallel connections, with their physical placement chosen for convenience or for other physical, electrical or thermal design constraints. In some embodiments, the batteries may be stacked or partially stacked, with the electrical communication established using other inter-cell connectors (not shown). Each battery (210a, 210b) may consist of a plurality of internal battery cells having electrolyte (not shown) in their interiors, each of which require supplementary watering over time. In alternative environments, each battery 202 is configured with a single interior battery cell having electrolyte in its interior.

Proper electrolyte levels in the batteries (more particularly, the battery cells of the batteries) may be accomplished using a single point watering system that includes a fill hose 212 in liquid communication with a water system manifold 214. The water system manifold 214 may be in liquid communication with an interior (not shown) of each respective battery through respective battery float valves 216. Each float valve 216 may be configured to open if the electrolyte in its associated battery is sufficiently depleted to activate the float valve 216 to receive water from the water system manifold 214 into the batteries' interior. The fill hose 212 may have a water connector 218 on its distal end 220 to enable fluid connection to a water source (indicated by an arrow) for delivery of the water to the water system manifold 214. In other embodiments, a plurality of fill hoses may be in liquid communication with a respective plurality of water system manifolds so that each battery in the system may have a water source to fill a respective battery should an interior electrolyte battery supply drop below a level that would activate its respective float valve.

On each end of the collection of batteries 202, positive and negative battery terminals (222, 224) are available for charging the batteries connected in series. A battery charger 226 may be in electrical communication with the batteries 202 to charge them, and a system controller 228 in the form of a battery monitor may be positioned adjacent the battery system 202 and may also be connected to the battery charger 226. The system controller 228 may be operable to enable a charging protocol that may be based in part on present battery temperature and detected charge rates. The battery temperature input for the system controller 228 may be taken from a temperature sensor 230, such as a thermistor that is disposed in an interior of one of the batteries. In a preferred embodiment, each temperature sensor 230 may extend down from a top portion of its respective battery cell interior down towards a bottom of the battery cell interior (see FIG. 3). Preferably, the temperature sensor 230 extends down into the electrolyte that is in the interior of the battery cell during normal operation. The temperature sensor 230 may produce a signal voltage that is indicative of a temperature measured by the temperature sensor 230 for communication to a processor 232 embedded in the system controller 228 (in this embodiment, the battery monitor). The system controller 228 may be configured to receive signals from the temperature sensor 230 over time, the signals comprising temperature measurement indications of an interior of the associated battery cell, such as the temperature of the enclosed electrolyte. The processor 232 may measure a change in electrolyte temperature over time, such as a decrease in electrolyte temperature, to determine whether a watering event has occurred. Such a determination may be based on whether the decrease in temperature is greater than a predetermined threshold during a first predetermined period of time and whether the decrease in temperature is normalized during a second predetermined length of time.

For example, water introduced through the water system manifold 214 to an interior of the battery cell is typically at a different temperature than the electrolyte pre-existing in the associated battery prior to the water's introduction. As the water is introduced into the electrolyte, the temperature sensor 230 may register a change in temperature of the resulting water and electrolyte solution. This change in temperature may be be measured as a sudden decrease an electrolyte temperature if the water introduced to the electrolyte solution is at a lower temperature then the pre-existing electrolyte solution in the battery cell. Alternatively, water introduced from the water system manifold 214 may be at a temperature that is higher than the pre-existing electrolyte in the battery cell and so the thermistor may register a sudden increase in temperature as the warmer water is introduced to the electrolyte solution. Because of the relative low thermal mass of the introduced water and electrolyte solution in comparison to the larger thermal mass of the remainder of the battery structure, the measured temperature of the introduced water and electrolyte solution may normalize rather quickly, as described in further detail, below.

In a preferred embodiment, each battery cell in the system of batteries 202, whether each battery (210a, 210b) is formed from a plurality of battery cells or a single battery cell, may have a respective thermistor 230 extending into an interior of the battery cell to measure and communicate a respective signal voltage indicative of battery cell temperature to the system controller 228. Alternatively, only an approximately center-positioned battery cell has an associated temperature sensor or less than all of the battery cells have an associated temperature sensor. In the case where the battery cell has electrolyte (i.e., is properly maintained), the temperature sensor may detect and measure a temperature of the electrolyte. As used herein, the term "processor" may encompass a processor, controller, microcontroller, microprocessor or a central processing unit (CPU).

A charger cable 234 may have proximal 236 and distal 238 electrical connectors coupled to the battery charger 226 and to an adapter cable 240, respectively. A controller cable 242 may also have proximal 244 and distal 246 electrical connectors coupled to the system controller 228 and adapter cable 240, respectively. Each of the charger cable 234, controller cable 242, and adapter cable 240 may have a pair of power lines 248 and a pair of communication lines 250. In the charger cable 234 and adapter cable 240, the power lines 248 are connected in a complementary manner to their respective connectors (236, 238 and 254, 252) to enable electrically continuity along the power line 248 path. Similarly, the communication lines 250 are connected in a complementary manner to their respective connectors (236, 238 and 254, 252) to enable electrical continuity along the communication line 250 path. In the controller cable, power lines (250a, 250b) are re-directed for electrical connection with negative and positive terminals (206, 204), respectively, to provide charging communication between the battery charger 226 and the batteries 202. The communication lines 250 may extend between connector 246 to connector 244 for electrical communication with the system controller 228 to complete electrical communication between the system controller 242 and battery charger 226.

The adapter cable 240 may be fixed to an electric vehicle (not shown), with its distal connector 252 proximate to the system controller 228 and batteries 202 and with its proximal connector 254 in a location that facilitates connection of the charger 226 and charging cable 234, such as at a rear position of the EV. Sensing cables (256a, 256b) connect the system controller 228 to the positive and negative terminals (222, 224) of the battery system 202 for monitoring and diagnosis of the batteries 202. The temperature sensor cable 258 provides electrical communication between the temperature sensor 230 and the system controller 228 to provide temperature measurement communication between them. In an alternative embodiment, the temperature sensor 230 is in electrical communication with the battery charger 226 directly through a sensor-charger cable 260. In such embodiments, the battery charger 226 may function as the system controller described above for the water event detection system 200, and the illustrated system controller 228 may be omitted in favor of direct charging of the batteries 202 by the battery charger 226.

Figure 3:
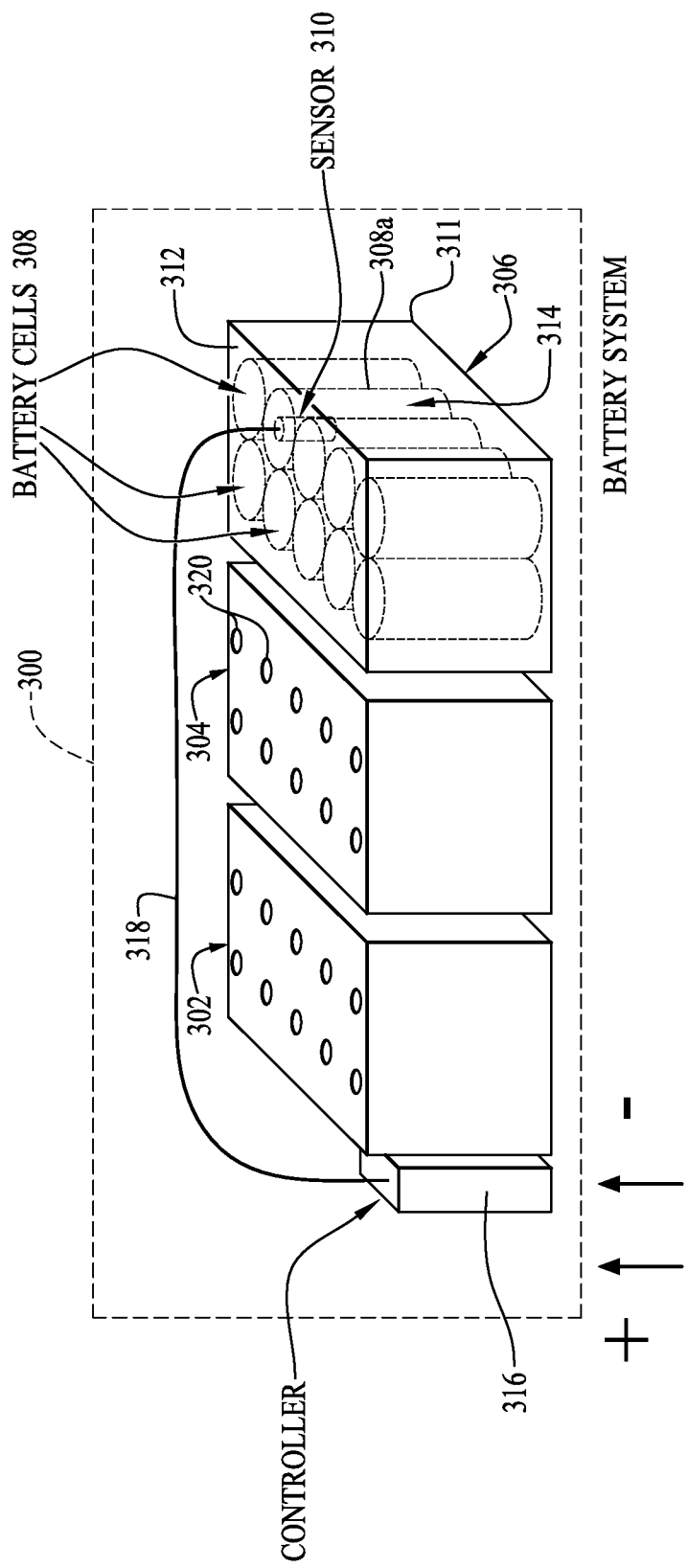
FIG. 3 is a side perspective view of another embodiment of water event detection system having a system controller that is configured to detect sudden changes in battery cell electrolyte temperature.

FIG. 3 is a side perspective view of a battery system 300 that includes a plurality of batteries, with each battery having a plurality of battery cells, and a controller in that is operable to detect a battery watering event in response to temperature data received from an electrolyte temperature sensor. First, second, and third batteries (302, 304, 306) are illustrated as positioned next to each other, with the third battery 306 formed with a plurality of battery cells 308. Seated in one battery cell 308a of the plurality of battery cells 308 in the third battery 306 is a temperature sensor 310 extending through an exterior casing 311 of third battery 306 from a top 312 of the battery 306 down into an interior 314 of the battery cell 308a. The temperature sensor 310 may be in communication with a system controller 316 through a sensor-charger cable 318. The temperature sensor 310 may send to the system controller 316 electrolyte temperature signals indicative of the temperature of the electrolyte that fills at least a portion of the interior 314 of the battery cell 308a. By this means, the system controller 316 may monitor the electrolyte temperature signals over time to determine whether a sudden temperature change has occurred (otherwise referred to as a temperature transition).

The temperature sensor 310 may be partially or fully immersed in the electrolyte as a result of the electrolyte level in the battery cell. Alternatively, the cell may be relatively devoid of electrolyte and the temperature sensor 310 may not reach the top level of the electrolyte. Although the third battery 306 is illustrated having a single temperature sensor 310 seated in a single battery cell 308a, in a preferred embodiment, each battery cell 308 in the third battery 306 would have a respective sensor in communication with the system controller 316 to enable monitoring and recording of water detection events in each of the cells. Similarly, each of the first and second batteries (302, 304) may have a respective plurality of battery cells (not shown), each of which may have a temperature sensor for communicating electrolyte temperature signals indicative of the respective temperatures of the respective electrolyte in its respective battery cell. Each of the batteries may be connected in electrical series (not shown) as provided in FIG. 2. Also, although not illustrated as having a single point watering system, each battery may be provided with a water fill port 320 for providing maintenance watering of each included battery cell, including water fill ports for the third battery 306 (not shown).

Figure 4:
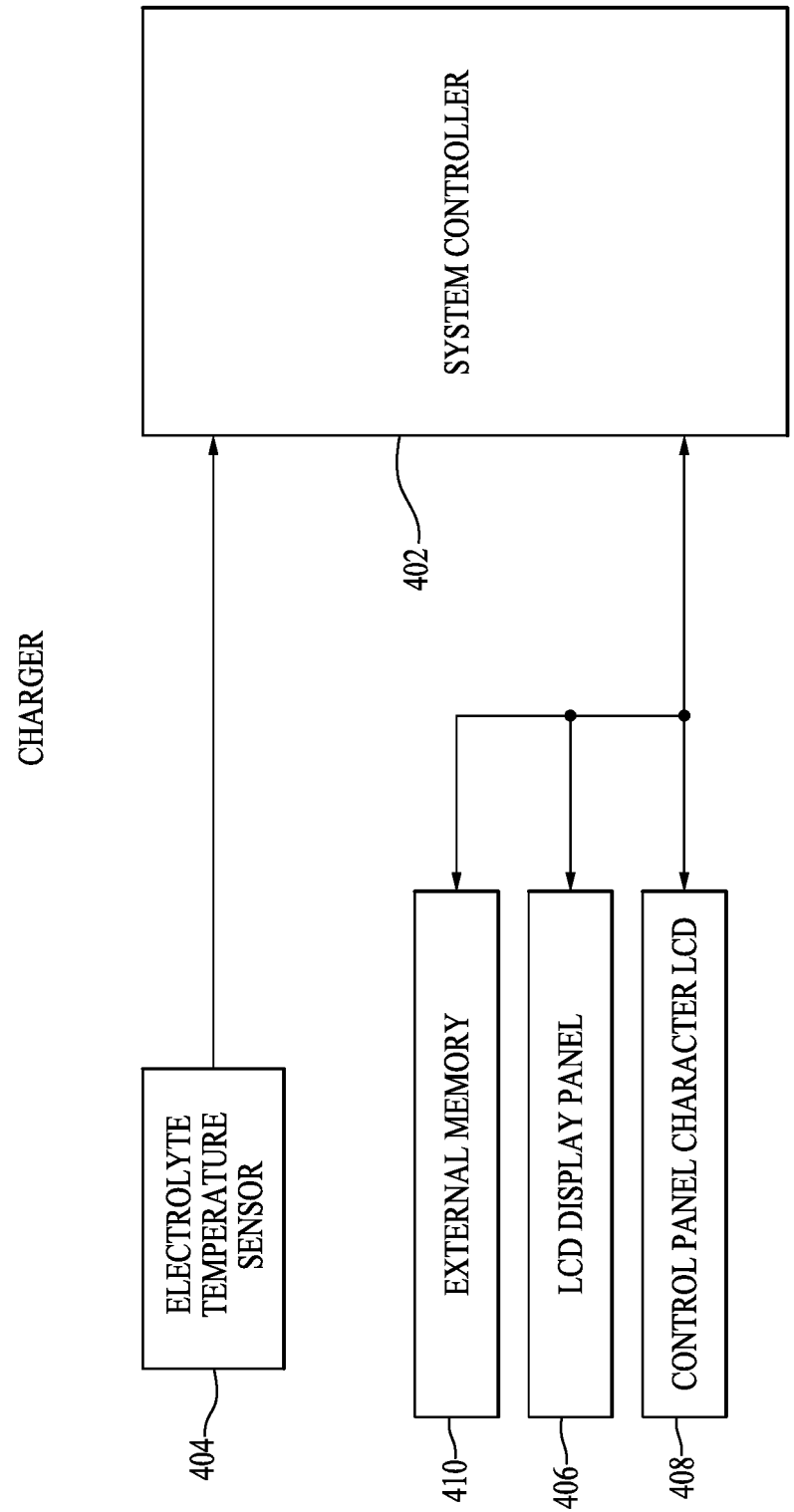
FIG. 4 is an exemplary system block diagram of a battery watering event detection system that may use a controller embedded in either a battery charger or in a battery monitor to detect sudden temperature changes at a temperature sensor.

FIG. 4 is an exemplary system block diagram of a battery watering event detection system that may use a controller embedded in either a battery charger or in a battery monitor, with the system controller connected directly to a temperature sensor and with the system controller programmed to enable detection of watering events in a battery cell. The system controller 402 may be in communication with an electrolyte temperature sensor 404 to receive voltage signals that are indicative of a temperature measured by the temperature sensor 404. The system may include a liquid crystal display (LCD) 406 and control panel character LCD 408 to enable graphic or alphanumeric information to be provided to a user regarding the time and date of water detection events and/or the number of water detection events over time. The displays (406, 408) may also be used for other purposes, such as system diagnosis and/or power indications and control. The electrolyte temperature sensor 404 is depicted as available to continuously send a temperature reading signal to the system controller 402. The system controller 402 may sample the temperature reading signals periodically, such as every second to every few minutes. The system controller 402 may receive input from the electrolyte temperature sensor 404 via an analog or digital communication path and so may be embodied as a wired or wireless communication method between the system controller 402 and temperature sensor 404. The system controller 402 may provide signals and/or data to an external memory 410 via a universal serial bus (USB) connection to save watering event data in response to determining by the system controller a sudden transition of the temperature of electrolyte in a monitored battery cell using the temperature sensor.

Figure 5:
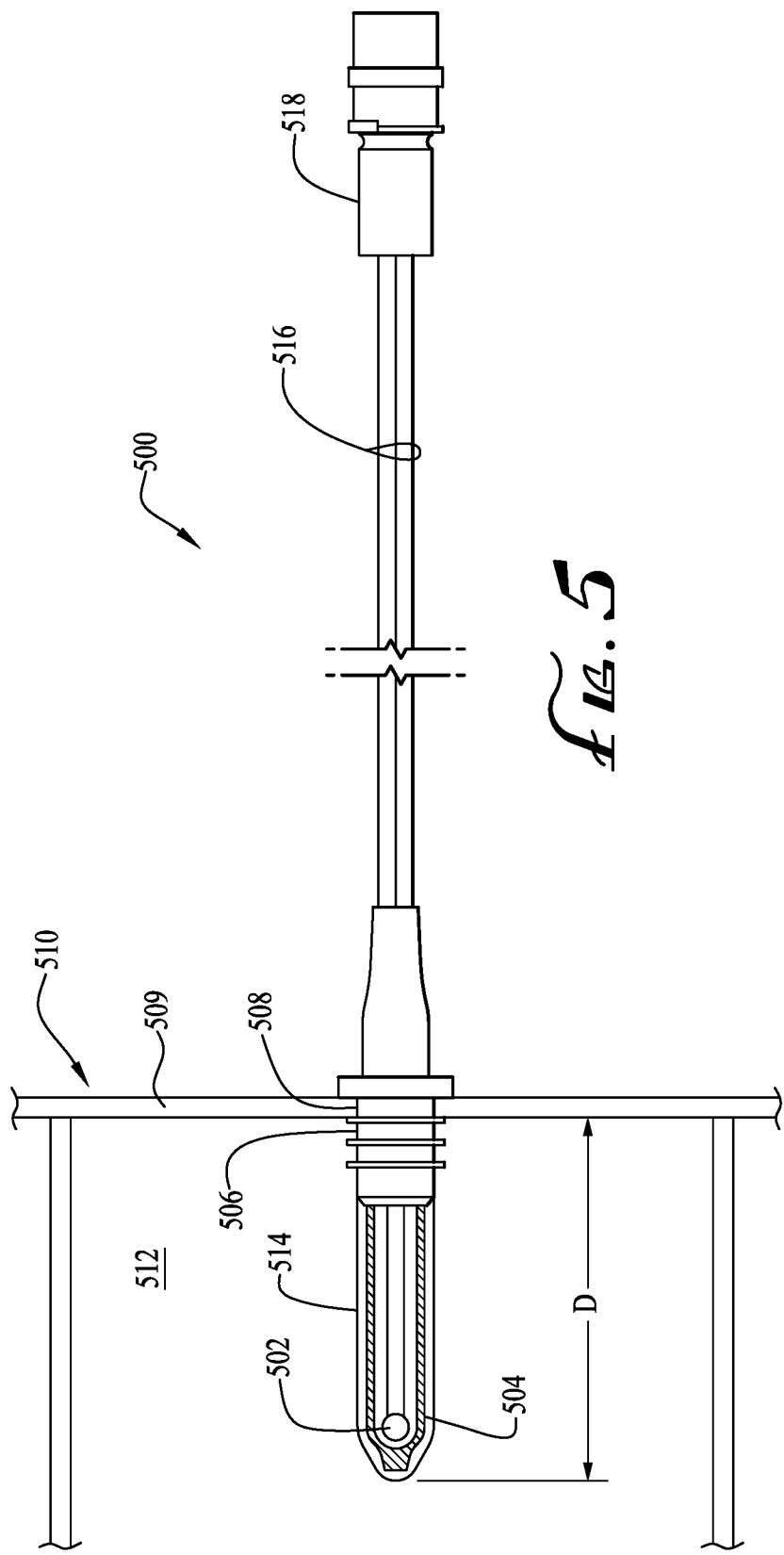
FIG. 5 is a side cross section view of one embodiment of the temperature sensor first illustrated in FIG. 2.

FIG. 5 is a side cross section view of one embodiment of the temperature sensor first illustrated in FIG. 2. The temperature sensor 500 may include a thermistor that is disposed and potted inside a protective jacket that may be a stainless steel jacket 504. The stainless steel jacket 504 protectively covers and encapsulates the thermistor 502 and is sealably coupled to a bushing 506 that is intended to be detachably coupled to a temperature sensor orifice 508 formed in an external casing 509 of a battery 510 for insertion into a battery cell 512. In other embodiments, the stainless steel jacket 504 may be formed of plastic or a glass. The jacket 504 may be coated with a thin layer of Teflon 514 for additional protection to otherwise extend the operational life of the temperature sensor 500. In one example implementation for use in a battery cell having a depth of between 12 and 30 inches, an outer diameter of the stainless steal jacket may be approximately ¼ inches and an insertion depth (D) of between approximately 1.25-3.25 inches. Temperatures signal wires 516 may provide the temperature indication signals from the thermistor 502 to a temperature sensor connector 518.

Figure 6:
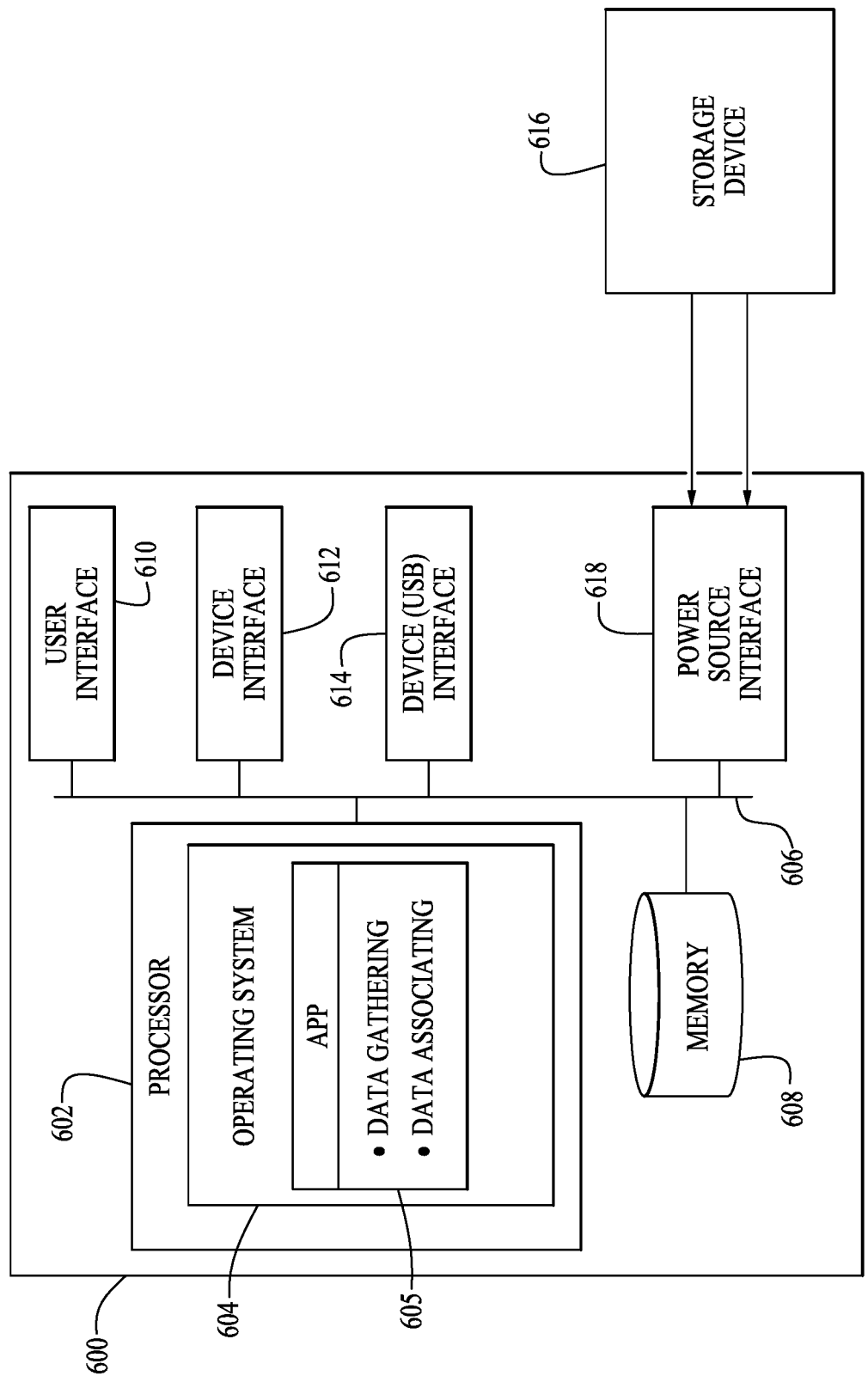
FIG. 6 is a functional block diagram of the battery watering event detection system where the system controller is embodied as a microprocessor running an operating system.

FIG. 6 is a functional block diagram of the battery watering event detection system 600 where the system controller 410 is embodied as a microprocessor 602 running an operating system 604 that supports an application 605 executing the steps of: data gathering, data associating, and preparing associated data for transmission. The microprocessor 602 is depicted as in communication via a data bus 606 with a memory store 608 where the microprocessor 602 may store the data. The microprocessor 602 is also depicted as being in communication with a user interface 610 and a device interface 612. The microprocessor 602 is also depicted as being in communication with another device interface 614 that may be a USB port configured to engage an optional flash drive having a USB interface. The microprocessor 602 is also depicted as being in communication with a power line of the EV battery unit, i.e., storage device 616, via a power source interface 618.

Figure 7:
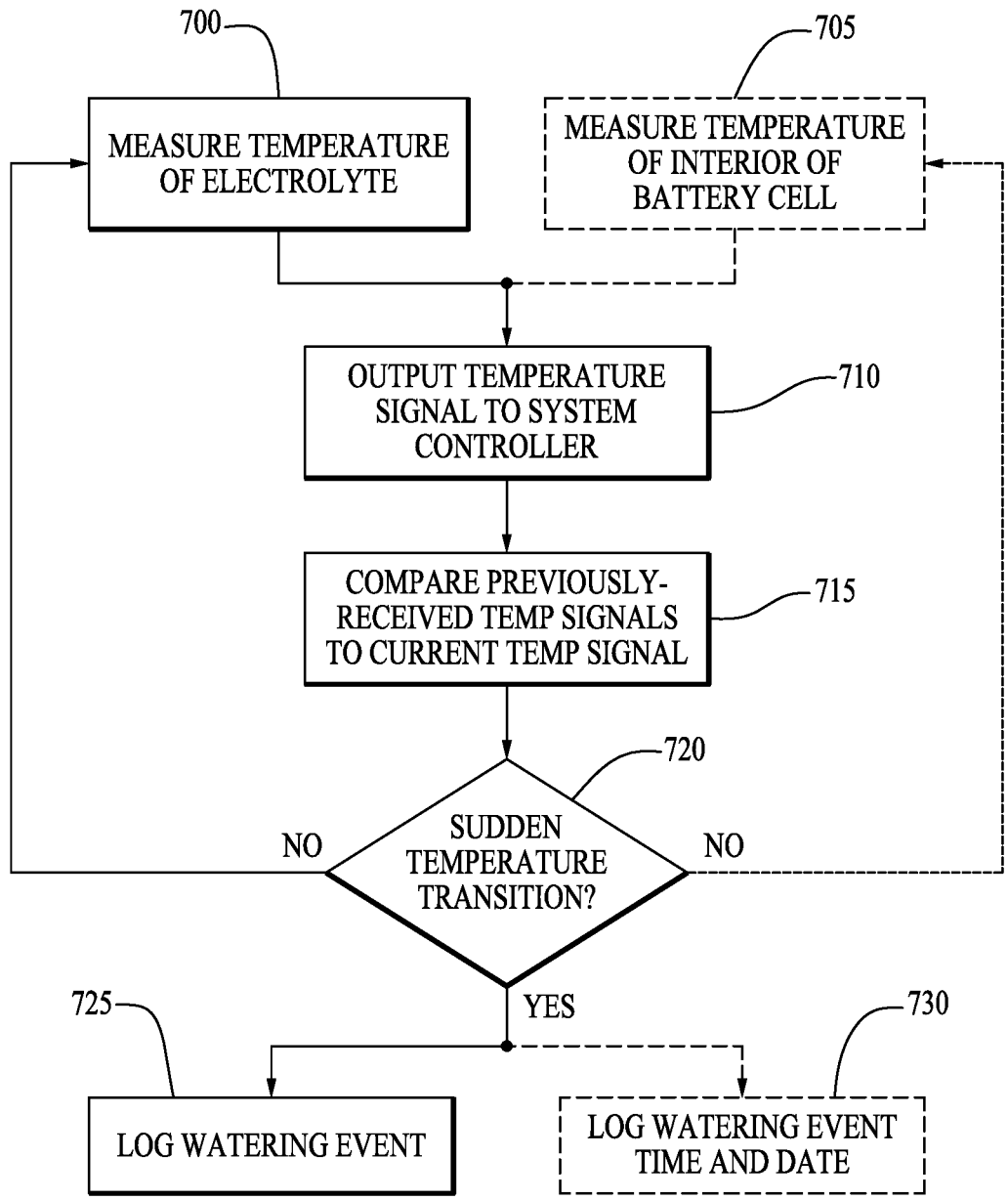
FIG. 7 is an exemplary flowchart for a method of detecting battery watering events using an electrolyte temperature sensor and a system controller.

FIG. 7 is an exemplary flowchart for a method of detecting battery watering events using an electrolyte temperature sensor and a system controller. A temperature of an electrolyte in the battery cell is measured using a temperature sensor (block 700). In an alternative embodiment the temperature sensor may measure a temperature of an interior of the battery cell (block 705) should the temperature sensor no longer be immersed in electrolyte. A plurality of electrolyte temperature signals may be output from the temperature sensor over time and provided to a system controller (block 710). The system controller may compare the most recently received temperature signal to previously received temperature signals (block 715) to determine whether a sudden transition in the electrolytes' temperature signals is found through the comparison (block 720). In one embodiment, in response to determining a greater than 1° C. magnitude temperature change over the course of less than one minute, the system controller may determine that a sudden transition in the electrolyte temperature signals water event was detected (block 720) and so log in a watering event date indication in a memory (block 725). In one embodiment, the log watering the event date and time is also logged in memory in response to the finding of a sudden transition (block 730).

Figure 8:
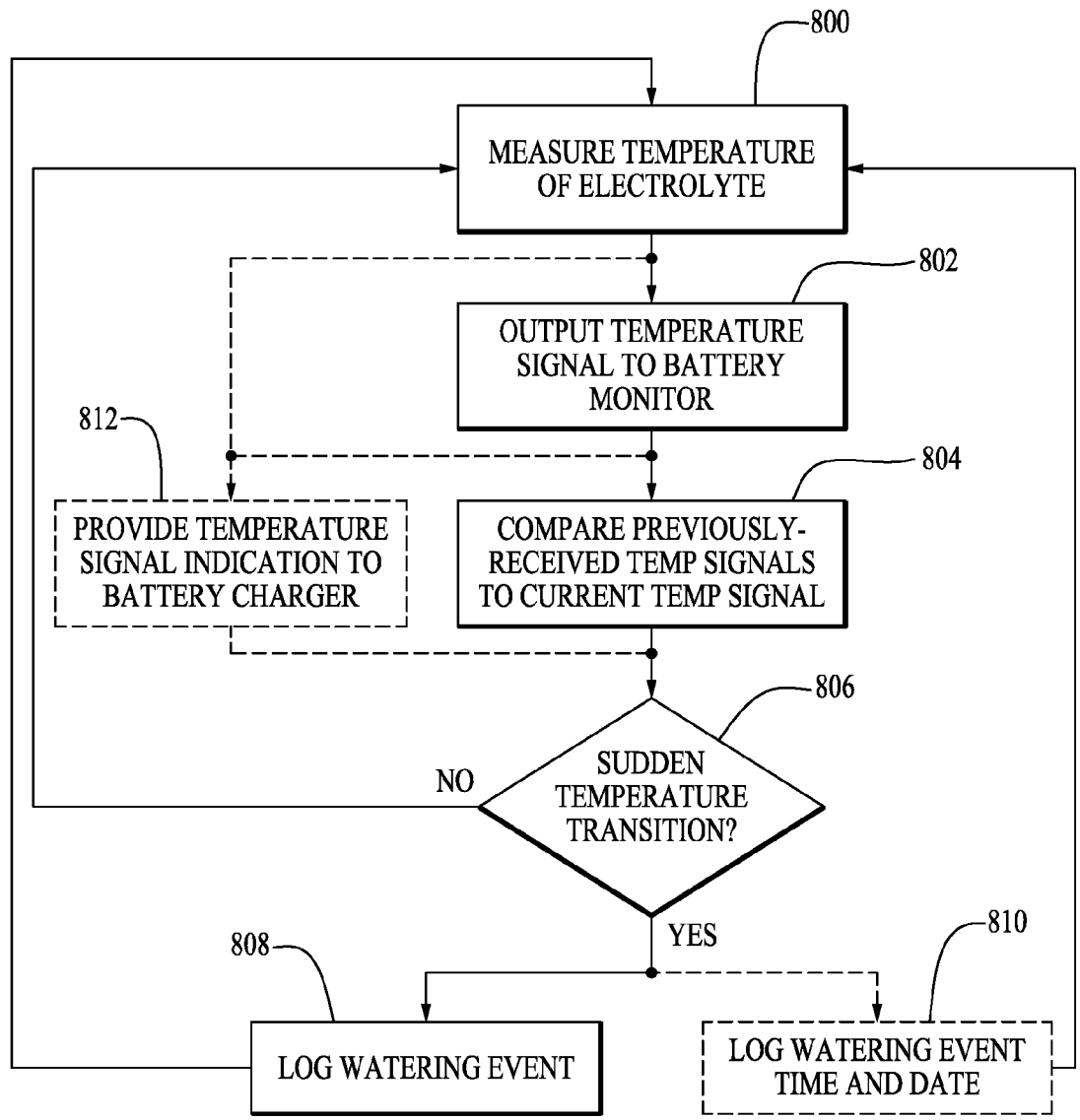
FIG. 8 is a flow diagram illustrating one embodiment of a system controller embedded in a battery monitor to look for sudden temperature sensor temperature transitions indicating a watering event.

FIG. 8 is a flow diagram illustrating one embodiment of a system controller embedded in a battery monitor to monitor a temperature of an electrolyte in the battery cell for sudden transitions indicating a watering event. In this embodiment, the temperature of an electrolyte in a battery cell is measured (block 800) and a voltage signal indicative of a temperature of the temperature sensor is output to a battery monitor (block 802). The current temperature signal is compared to previously received temperature signals (block 804). If a sudden temperature transition is determined by the processor (block 806), such as a sudden decrease in temperature at the temperature sensor, then the processor may determine whether a battery cell watering event has occurred based on this sudden change in the temperature at the temperature sensor (block 806), and log a watering event (block 808). In one embodiment, a sudden temperature transition may be determined when a change in temperature of the temperature sensor is detected as greater than 1° C. per minute. For example, during typical operation, addition of maintenance water and a battery cell will result in a sudden temperature drop. In other embodiments, a sudden temperature transition may be determined when a change in temperature of the temperature sensor is detected having a magnitude of between 4° C. and 7° C. over a five to ten-minute period.

In other embodiments, rather than measuring the temperature of an electrolyte (block 800) and then outputting the temperature signal to a battery monitor (block 802), the temperature signal is instead provided directly to a battery charger (block 812). In further embodiments, after the temperature signal is received in the battery monitor (block 812) the temperature signal is then provided to a battery charger (block 812) for determination of whether a sudden temperature transition is detected (block 806) for logging of a watering event (block 808). In other embodiments, the time and date of the watering event is also logged (block 810) and the total number of watering events may be counted and logged over time.

Figure 9:
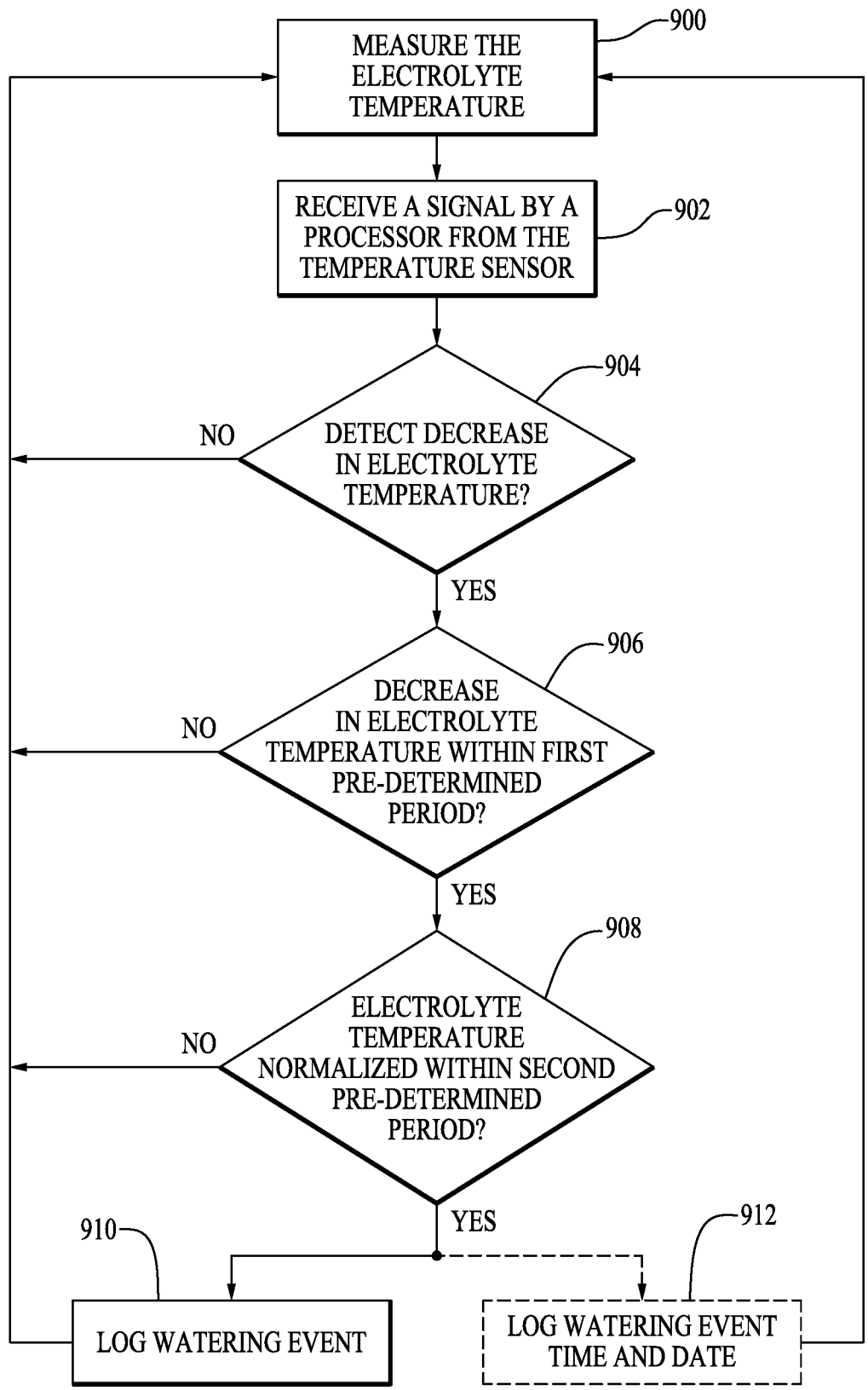
FIG. 9 is a flow diagram illustrating one embodiment of a method of detecting a battery cell watering event in batteries that require watering.

FIG. 9 is a flow diagram illustrating one embodiment of a method of detecting a battery cell watering event in batteries that require watering. The electrolyte temperature is measured (block 900) and a processor receives a signal from the temperature sensor having the measurement (block 902). If a decrease is detected in the electrolyte temperature in comparison to a previous measurement (block 904) then the decrease in electrolyte temperature is compared to a first predetermined period (block 906) to determine if a watering event has occurred based on the magnitude of the temperature decrease over time. In one embodiment, if a sudden decrease is determined (block 906) then the electrolyte temperature is again detected and measured overtime to determine whether the decrease in temperature is normalized during a second predetermined length of time (block 908). If both the decrease in electrolyte temperature is within the first predetermined and the electrolyte temperature is normalized within the second predetermined period (blocks 906, 908), then a watering event is logged (block 910). In some embodiments, the watering event is logged with the event date and time as well (block 912). If any of the tests (blocks 904, 906, 908) fail, then the processor continues to receive electrolyte temperature measurements from the temperature sensor (blocks 900) for data that would indicate a log watering event.

In a summary of the above processor steps, the algorithm being executed by a processor may determine a watering event by continually measuring DT/dt, where DT/dt is the change of measured temperature at the temperature sensor over time. If the measured temperature changes suddenly and with a large enough magnitude (such as a sudden decrease in temperature), then time is measured verses temperature to determine if the temperature returns to its previous point in the correct amount of time. The continual measuring of the temperature may be based on a sampling rate where the sampling rate may, for example, be 1 second to 12-hour sampling rate. The sampling rate may also be measured as a number of cycles per second and may for example be a sampling rate of 0.2 Hz.

In another exemplary embodiment, the processing steps used to determine whether a watering event has occurred may be implemented in a battery charger, rather than a battery monitor, by receiving temperature measurements either digitally through a compatible battery monitor or directly from the temperature sensor should the battery monitor not be compatible or not be present. Alternatively, the processing steps used to determine whether a wiring event has occurred may be implemented directly in a battery monitor and either stored in the battery monitor for later retrieval, displayed on the battery monitor for contemporary viewing or the data conveyed to an external memory or battery charger.

More particularly, during a typical charging operation, the battery warms up to a temperature well above an ambient temperature that may be, for example, between 15 and 24 degrees Celsius. Water that is added to a battery is typically at ambient temperature. Accordingly, when water is added to the battery, the temperature sensor located near the top of the cell measures a sudden decrease in temperature that lasts for several minutes, but after several more minutes the temperature slowly rises back to its starting point due to the large thermal mass of the battery cell and the mixing action of the gassing during EQ.

Figure 10:
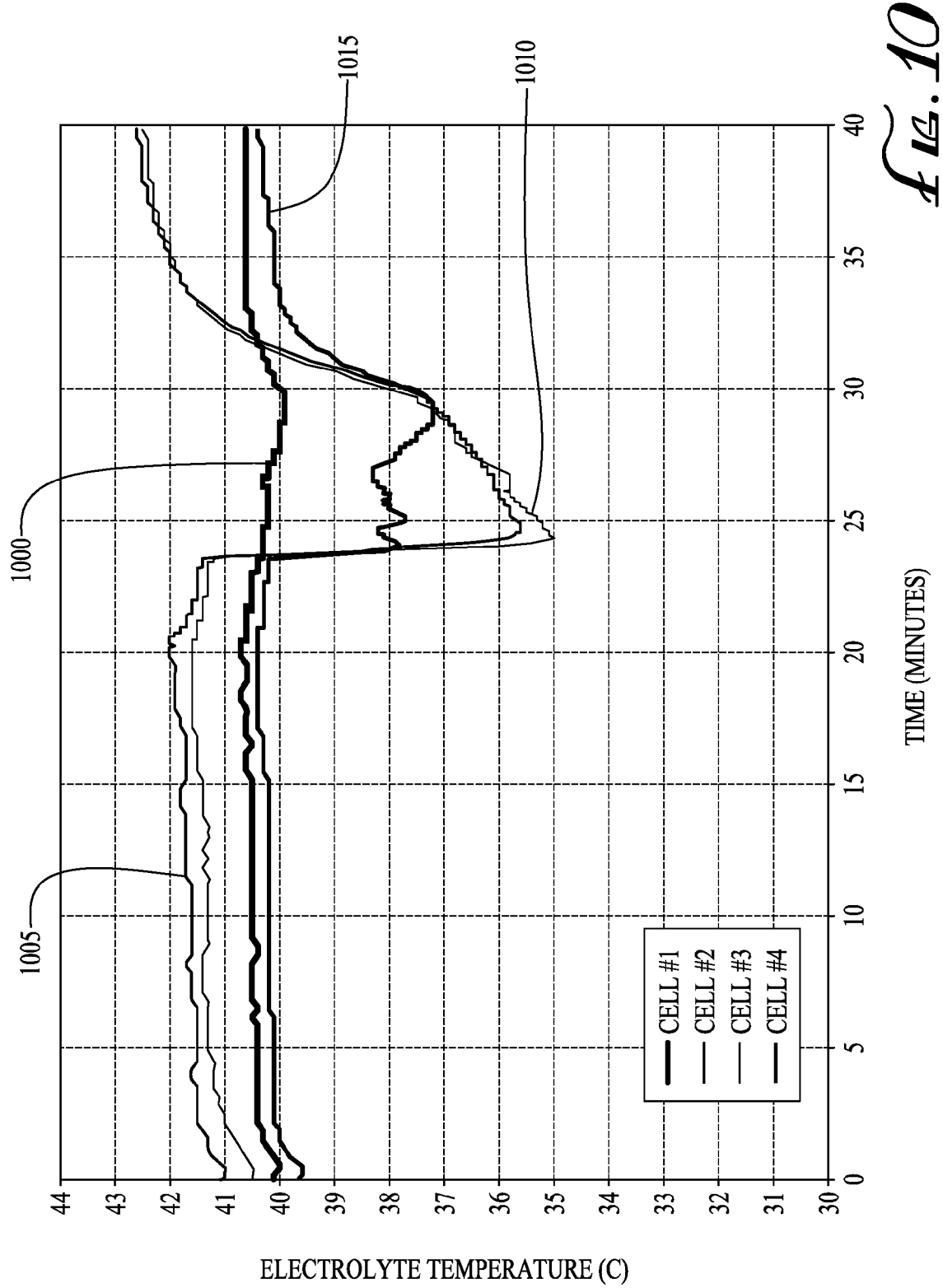
FIG. 10 is a graph illustrating the electrolyte temperature of several battery cells before, during, and after a watering event.

FIG. 10 is a graph illustrating the electrolyte temperature of several battery cells before, during, and after a watering event that occurs at approximately the 24-minute mark on the graph. In this graph which measures the electrolyte temperature (in Celsius) against time (in minutes), four battery cells are used as having initial and steady-state electrolyte temperature readings between 0 and approximately 24 minutes on the graph. More specifically, the data line for exemplary cell # 1 1000 has a near uniform electrolyte temperature reading over time which may indicate little if any water was added during the measured period, likely because the water level was at a sufficient level. Exemplary cell #2 1005 and exemplary cell #3 1010 appear to have had very low electrolyte levels or the temperature sensor may have not even been in the electrolyte before the watering event, with their data lines showing the temperature after watering/mixing as being higher than before the watering event. In contrast, cell #4 1015 appears to have had a relatively high electrolyte level and so the small amount of cool water did not influence the temperature significantly. The graph illustrates an electrolyte temperature response to a watering event for the exemplary battery cells where a drop in temperatures of approximately >1 degrees C. in less than 1 minute may indicate the occurrence of a watering event.

In summary of the written disclosure above, method and system embodiments may include an electrolyte immersed temperature sensor configured to measure electrolyte temperature of an energy storage device and a processor in communication with the energy storage device and the electrolyte immersed temperature sensor, where the processor may be configured to: receive a signal from the energy storage device, the signal comprising continual measurements of temperature of the energy storage device; detect a sudden decrease in temperature of the energy storage device based on the received signal from the electrolyte immersed temperature sensor and the electrolyte immersed temperature sensor measuring a sudden battery electrolyte temperature decrease; and determine whether a watering event has occurred based on the detected sudden decrease in temperature of the energy storage device and whether the decrease in temperature is over/above a predetermined threshold and where the decrease in temperature dissipated/receded during a predetermined length of time.

Optionally, the energy storage device of the battery watering event detection system may comprise one or more electromechanical cells and the electrolyte immersed temperature sensor may measure electrolyte temperatures of the energy storage device near a top portion of the one or more electromechanical cells. Additionally, the processor may further be configured to record a time and date of the determined watering event or the processor may further be configured to record a total number of occurrences of the determined watering event for the energy storage device. In one embodiment, the energy storage device may be a battery used in electric vehicles.

Exemplary method and system embodiments may include a device where the decrease in temperature dissipated/receded during a predetermined length of time and may be determined by starting a timer once the decrease in temperature is over/above the predetermined threshold. In one embodiment the predetermined length of time may be five minutes and the predetermined threshold of decrease in temperature may be seven degrees Celsius.

It is contemplated that various combinations and/or subcombinations of the specific features and aspects of the above embodiments may be made and still fall within the scope of the invention. Accordingly, it should be understood that various features and aspects of the disclosed embodiments may be combined with or substituted for one another in order to form varying modes of the disclosed invention. Further it is intended that the scope of the present invention herein disclosed by way of examples should not be limited by the particular disclosed embodiments described above.

What is claimed, is:

1. A method of battery cell monitoring, comprising:
   measuring a temperature of an electrolyte in a battery cell using a temperature sensor;
   outputting from the temperature sensor a plurality of electrolyte temperature signals indicative of the temperature of the electrolyte over time;
   providing the plurality of electrolyte temperature signals to a system controller;
   determining by the system controller a sudden transition in the electrolyte temperature signals;
   logging a watering event data indication in a memory in response to calculating the sudden transition; and
   determining whether the battery cell has been adequately maintained over time based on the logged watering event data.

2. The method of claim 1, wherein the sudden transition indicates a change in temperature of the electrolyte of greater than one degree Celsius (C) per minute.

3. The method of claim 2, wherein the change in temperature of the electrolyte of greater than one degree Celsius (C) per minute is greater than one degree C. of cooling per minute.

4. The method of claim 1, wherein the sudden transition indicates a change in temperature of the electrolyte of approximately 4 to 7 degrees C. over 5 to 10 minutes.

5. The method of claim 1, wherein the system controller forms part of a battery charger.

6. The method of claim 1, wherein the system controller forms part of a battery monitor.

7. The method of claim 1, wherein the temperature sensor is immersed in the electrolyte of one of a plurality of battery cells in a battery.

8. A method of battery cell monitoring, comprising:
   detecting the temperature of an interior of a battery cell using a temperature sensor;
   outputting from the temperature sensor a plurality of temperature signals indicative of the temperature of the interior of a battery cell over time;
   providing the plurality of temperature signals to a processor;
   calculating by the processor a sudden transition in the plurality of- temperature signals;
   storing a watering event data indication in response to calculating the sudden transition; and
   determining by the processor whether the battery cell has been adequately maintained over time based on the stored watering event data;
   wherein the processor is a data processing unit selected from the group consisting of a controller, microprocessor and processor.

9. The method of claim 8, wherein the sudden transition indicates the temperature sensor was not immersed in a liquid in a first time and was immersed in a liquid in a second time.

10. The method of claim 1, wherein the system controller is a microprocessor.

11. The method of claim 7, wherein the one of the plurality of battery cells is a center cell in the battery.

12. The method of claim 1, wherein the temperature sensor comprises a thermistor seated in a stainless steel sheath.

13. The method of claim 1, wherein the temperature sensor extends from a top of the battery cell interior down towards a bottom of the battery cell interior.

14. A method comprising:
   disposing at least one sensor within a battery cell electrolyte of a battery system, wherein the at least one sensor provides a voltage signal indicative of a temperature of the at least one sensor;
   electrically coupling a controller to the sensor, the controller comprising a processor, memory, and a battery watering detector;
   receiving, at the controller, a plurality of voltage signals from the sensor wherein the voltage signals indicate the temperature of electrolytes sensed by the sensor;
   storing a plurality of voltage values corresponding to the plurality of voltages signals received at the controller into the memory over a period of time;
   detecting, by the detector, a change in the voltage values over time indicating a decrease in electrolyte temperature of the battery cell;
   determining, by the detector, whether a watering event has occurred based on whether the decrease in temperature is greater than a predetermined threshold during a first predetermined period of time and whether the temperature is normalized during a second predetermined period of time; and
   storing said determined watering events into memory; and
   determining whether the battery system has been adequately maintained over time based on the stored watering events.

15. The method of claim 14, wherein the predetermined threshold during the first predetermined period of time is greater than one degree Celsius (C) per minute.

16. The method of claim 14, wherein the predetermined threshold during the first predetermined period of time is 4 to 7 degrees C. over 5 to 10 minutes.

17. The method of claim 14, wherein the system controller forms part of a battery charger.

18. The method of claim 14, wherein the system controller forms part of a battery monitor.

* * * * *